United States Patent [19]

Bartmann et al.

[11] Patent Number: 5,106,718
[45] Date of Patent: Apr. 21, 1992

[54] POSITIVE PHOTORESIST COMPOSITION CONTAINING ALKALI-SOLUBLE PHENOLIC RESIN, PHOTOSENSITIVE QUINONEDIAZIDE COMPOUND AND SULFONYL CONTAINING COMPOUND

[75] Inventors: Ekkehard Bartmann, Erzhausen; Reinhard Schulz, Staufen-Wettelbrunn; Horst Münzel, Reutlingen, all of Fed. Rep. of Germany

[73] Assignee: Ciba-Geigy Corporation, Ardsley, N.Y.

[21] Appl. No.: 648,954

[22] Filed: Feb. 1, 1991

Related U.S. Application Data

[63] Continuation-in-part of Ser. No. 422,351, Oct. 16, 1989, abandoned.

[30] Foreign Application Priority Data

Oct. 20, 1988 [DE] Fed. Rep. of Germany ....... 3835737

[51] Int. Cl.⁵ .................. G03F 7/023; G03C 1/61
[52] U.S. Cl. .................................. 430/191; 430/165; 430/190; 430/192; 430/193; 430/326
[58] Field of Search .................. 430/191, 196, 330

[56] References Cited

U.S. PATENT DOCUMENTS

| | | | |
|---|---|---|---|
| 2,416,773 | 3/1947 | Reichel | 430/191 |
| 4,093,461 | 6/1978 | Loprest et al. | 430/330 |
| 4,668,606 | 5/1987 | DoMinh et al. | 430/271 |
| 4,719,166 | 1/1988 | Bleuins et al. | 430/166 |
| 4,889,789 | 12/1989 | Stahlhofen | 430/191 |

FOREIGN PATENT DOCUMENTS 0301332 2/1989 European Pat. Off. ............ 430/191

*Primary Examiner*—Charles L. Bowers, Jr.
*Assistant Examiner*—Christopher G. Young
*Attorney, Agent, or Firm*—JoAnn Villamizar

[57] ABSTRACT

The invention relates to positive photoresists based on alkali-soluble phenolic resin and photosensitive quinonediazide compounds which, by means of particular additives, give relief structures produced therewith an increased stability towards changes due to thermal effects.

3 Claims, No Drawings

POSITIVE PHOTORESIST COMPOSITION CONTAINING ALKALI-SOLUBLE PHENOLIC RESIN, PHOTOSENSITIVE QUINONEDIAZIDE COMPOUND AND SULFONYL CONTAINING COMPOUND

This is a continuation-in-part application of application Ser. No. 422,351, filed Oct. 16, 1989, now abandoned.

The invention relates to positive photoresists which give relief structures produced therewith an increased stability towards changes due to thermal effects.

The term "photoresists" conventionally denotes organic polymer materials which can be structured by light and which are used in photolithographic processes and related techniques, for example for the manufacture of printing plates, printed electrical circuits and printed circuit boards or, in particular, in microelectronics for the manufacture of integrated semiconductor components.

To produce the circuit structures for the manufacture of integrated microelectronic semiconductor components, the semiconductor substrate material is coated with the photoresist; positive or negative photoresist relief structures are then obtained by imagewise exposure of the photoresist layer and subsequent developing. These relief structures serve as a mask for the actual structuring processes on the semiconductor substrate, such as etching, doping or coating with metals, other semiconductor materials or insulating materials. As a rule, the photoresist masks are then removed. The circuit structures of microchips are formed on the substrate by carrying out a large number of such process cycles.

The conventional type of positive photoresist contains, in an organic solvent, essentially at least one resin soluble in aqueous alkalis and at least one photosensitive quinonediazide compound which reduces the alkali solubility of the resin, and conventionally additional modifying ingredients. The action of radiation on photoresist layers produced with such compositions increases the alkali solubility in the exposed areas by photoinduced structural conversion of the quinonediazide compound into a carboxylic acid derivative, so that positive photoresist relief structures are obtained after developing in aqueous-alkaline developing baths.

The constant advances in miniaturization in semiconductor technology and microelectronics are making very high demands on photoresist materials and the relief structures which they are to produce.

In addition to the sensitivity, resolution and contrast of the photoresist and the adhesive strength and mechanical and chemical stability of the photoresist material or of the relief structures produced, during the other process steps, especially developing and plasma etching, particular importance attaches to the dimensional stability and resistance of the photoresist relief structures under the effect of elevated temperatures. Conventionally, the photoresist relief structures obtained after exposure and developing are subjected to a heating step (post bake) in which the temperatures acting on the structures are well above 100° C. and generally in the range from 120° to 180° C. The purpose of this heating step is to drive off any volatile constituents still present and thereby to bring about a better substrate adhesion and curing of the resist structures and a reduction in the erosion during subsequent plasma etching steps. Temperatures in this range also occur during plasma etching.

However, positive photoresists based on alkali-soluble resin and quinonediazide compounds often have an inadequate heat stability. This is shown by the fact that the resist structures begin to deform due to flow phenomena under the effect of temperatures above 120° C., the result of which is to impair contour sharpness and slope as well as the geometry of the structures. This reduces the dimensional accuracy of the transfer of the structure on to the substrate.

It is possible to improve the heat stability of positive photoresist relief structures by means of aftertreatment procedures, for instance irradiation with middle or far UV or chemical aftertreatment, e.g. with formaldehyde. The object of such aftertreatment procedures is to effect crosslinking within the developed photoresist relief structures in order to raise the softening point or flow temperature of the material. Additional UV irradiation carries the risk of producing bubbles or flakes in the resist structures, thereby reducing the yield. All procedures of this type incur additional expenditure and are time-consuming; chemical aftertreatment is accompanied by further problems such as compatibility and possible toxicity, and problems relating to the handling and disposal of the chemicals used.

To improve the heat stability of photoresists, it has also been proposed to incorporate a very wide variety of additives into the resist formulations themselves, for example hexamethylenetetramine in Research Disclosure, June 1984, no. 24205, peroxides in W.M. Moreau, Microcircuit Engineering 1983, page 321 et seq., azides in European patent application A-O 140 376 and dialkylbenzylamine derivatives in Japanese Kokai 61-36742. The object of incorporating such additives is again to crosslink the photoresist material.

However, azides and peroxides are sensitive to UV radiation, as used in photoresist technology, and effect crosslinking in the exposed areas of the resist layer by photoinduced radical formation, although this is totally undesirable in the case of positive processes.

Hexamethylenetetramine and benzylamine compounds are acid-labile. This acid lability is more pronounced in the presence of novolak resins. Traces of acid in positive photoresists, due to the novolak resins used in their manufacture, are practically unavoidable; also, the decomposition of the quinonediazide component contained in the resist, which cannot really be completely eliminated, leads to acid degradation products. For this reason, additives of this type also lead, as a result of acid-induced degradation, to incalculable undesired crosslinking reactions both in the photoresist solution and in the photoresist layer.

Thus, on account of their inherent adverse effects, the methods known hitherto for improving the heat stability of photoresists do not represent the ideal solution to this problem.

The object of the invention was therefore to find additives which, in positive photoresists based on alkali-soluble phenolic resin and photosensitive quinonediazide compounds, effectively increase the stability of relief structures produced with said photoresists towards changes due to thermal effects, without thereby adversely affecting the other properties.

Surprisingly, it has now been found that compounds of formula I:

$$R^1-SO_2-CHR^2-X \qquad (I),$$

wherein X is OH or $NR^3R^4$, $R^1$ to $R^4$ are each independently of the other alkyl, cycloalkyl, aryl or aralkyl containing up to 12 C atoms, the latter being unsubstituted or monosubstituted or polysubstituted by OH, halogen, cyano, nitro, alkyl, alkoxy, alkylthio, mono- or bis-alkylamino, alkanoyl, alkanoyloxy, alkanoylamido, alkoxycarbonyl, alkylaminocarbonyl or aryloxy containing up to 6 C atoms in each case, $R^2$ and $R^3$ are additionally hydrogen and $R^4$ is additionally the group $R^1$—$SO_2$—$CHR^2$—, are especially suitable for this purpose.

The invention accordingly relates to positive photoresists comprising, in an organic solvent, essentially
a) at least one alkali-soluble phenolic resin,
b) at least one photosensitive quinonediazide compound and, if appropriate, other conventional additives, and containing at least one compound of formula I in a proportion which increases the stability of photoresist relief structures produced with said photoresists towards changes due to thermal effects.

The invention further relates to the use of compounds of formula I as additives in positive photoresists based on alkali-soluble phenolic resin and photosensitive quinonediazide compounds, for increasing the stability of photoresist relief structures produced with said photoresists towards changes due to thermal effects.

The additives of formula I which are to be incorporated, according to the invention, into the positive photoresists for increasing the heat stability are compounds of the α-hydroxysulfone or α-aminosulfone type, which can be specified in greater detail by formulae Ia–Ic below:

$$R^1—SO_2—CHR^2—OH \quad \text{(Ia)}$$

$$R^1—SO_2—CHR^2—NR^3R^4 \quad \text{(Ib) and}$$

$$R^1—SO_2—CHR^2—NR^3—CHR^2—SO_2—R^1 \quad \text{(Ic)}$$

These are essentially known compounds which can easily be prepared by conventional synthetic processes. Compounds of formula Ia are obtainable by the addition of appropriate sulfinic acid precursors on to aldehydes. If this addition is performed in the presence of appropriate amines or if the compounds of formula Ia are subsequently aminated, the compounds of formula Ib or Ic are obtained.

In formulae I or Ia, Ib and Ic, $R^1$ can be alkyl, cycloalkyl, aryl or aralkyl containing up to 12 C atoms, the latter being in each case un- substituted or monosubstituted or polysubstituted by OH, halogen, cyano, nitro, alkyl, alkoxy, alkylthio, mono- or bis-alkylamino, alkanoyl, alkanoyloxy, alkanoylamido, alkoxycarbonyl, alkylaminocarbonyl or aryloxy containing up to 6 C atoms in each case.

$R^2$, $R^3$ and $R^4$ can independently be defined in the same way as $R^1$ and can additionally be hydrogen. In these formulae, $R^1$ is preferably phenyl or substituted phenyl; $R^2$, $R^3$ and $R^4$ are preferably hydrogen. Compounds of formula Ia, in particular those in which $R^1$ is phenyl or substituted phenyl and $R^2$ is hydrogen, are especially preferred.

Typical examples of such compounds are hydroxymethylsulfonylbenzene, 1-(hydroxymethylsulfonyl)-4-methylbenzene, 1-(hydroxymethylsulfonyl)-4-methoxybenzene, 1-(hydroxymethylsulfonyl)-4-chlorobenzene and 1-(hydroxymethylsulfonyl)-4-nitrobenzene.

Examples of typical representatives of compounds of formula Ib are phenyl(phenylsulfonylmethyl)amine, phenyl(p-tolylsulfonylmethyl)amine, (3-nitrophenyl)(4-methylphenylsulfonyl)phenylaminomethane and benzyl(4-methylphenylsulfonyl)phenylaminomethane.

Typical examples of compounds of formula Ic are bis(phenylsulfonylmethyl)amine and bis(p-tolyl-sulfonylmethyl)amine.

When incorporated as additives in positive photoresists based on alkali-soluble phenolic resin and photosensitive quinonediazide compounds, the compounds of formula I provide extremely effective stabilization of relief structures produced with such photoresists towards changes due to thermal effects. This is particularly evident in the prevention of contour rounding at temperatures above 120° C. It is assumed that the compounds of formula I cause crosslinking to take place in the developed photoresist relief structures under the effect of elevated temperatures. The amount used is largely uncritical and can easily be determined and optimized for the particular individual compound and the particular resist formulation by means of simple routine tests. 0.1–10% by weight, based on the total amount of photoresist solution, has proved to be a convenient range. The results are particularly favourable if the compounds of formula I are present in a proportion of 1–5% by weight, based on the total amount of photoresist solution. When the amounts of compounds used were in the ranges indicated, no adverse effects on the other properties of the photoresist could be established. In particular, there was no premature crosslinking in the resist solution or in the irradiated image areas of the resist layer.

In terms of their main constituents, namely alkali-soluble phenolic resin and photosensitive quinonediazide compound, the positive photoresists stabilized according to the invention by the additives of formula I towards thermal effects correspond essentially to the qualitative and quantitative compositions which are conventionally used for this purpose at the present time.

In principle, all the alkali-soluble phenolic resins conventionally used in photoresist technology are suitable as resin components, e.g. novolak resins, which are obtained by the condensation of phenol or phenolic compounds with aldehydes. Cresol-formaldehyde resins, which are prepared using o-, m- or p-cresol or mixtures of these isomers in arbitrary or predetermined ratios, are preferred. The preparation of such resins and their use in positive photoresists are disclosed e.g. in U.S. Pat. No. 4,377,631. In addition to these resins, other alkali-soluble resins, such as those frequently used in positive resists, are also possible. These include, for instance, polyvinylphenols and polyglutarimides, copolymers of styrene and α-methylstyrene with maleimide and copolymers of N-(p-hydroxyphenyl)maleimide with olefins. It is also possible to use silylated derivatives of alkali-soluble polymers which have a higher resistance to plasma etching. In positive photoresists, the resin component normally represents a proportion of about 40–70% by weight, based on the total solids content.

In the positive photoresists of the invention, it is preferred to use m-cresol-novolak resins with a relatively high average molecular weight, preferably of between about 8,000 and 18,000, and a narrow molecular weight distribution.

The photosensitive quinonediazide compounds conventionally used in positive photoresists are esterification products of 1,2-naphthoquinone-2-diazide-5-sulfonic acid or 1,2-naphthoquinone-2-diazide-4-sulfonic acid with low-molecular aromatic hydroxyl compounds, especially hydroxybenzophenones such as 2,3,4-trihydroxybenzophenone and 2,3,4,4,'-tetrahydroxybenzophenone, and trihydroxybenzenes such as 1,3,5-trihydroxybenzene. These naphthoquinonediazide compounds have a broad absorption in the near to middle UV wavelength range between ca. 300 and 450 nm. This wavelength range includes strong emission lines of the mercury discharge lamps conventionally used in projectors, for example the lines at 313 nm, 334 nm, 365 nm, 405 nm and 436 nm.

The photosensitive components which are preferably used in the positive photoresists of the invention are 1,2-naphthoquinonediazide-5-sulfonyl esters of trihydroxybenzene isomers. These can be the trisesters of 1,2,3-, 1,2,4- and 1,3,5-trihydroxybenzene. These compounds are known and can easily be obtained as pure full esters by esterification of the appropriate trihydroxybenzene isomers with 1,2-naphthoquinonediazide-5-sulfonyl chloride. The isomeric forms of these trisesters are normally used pure, but can also be used as mixtures with one another. The proportion in which they are used in the positive photoresists of the invention is such that the resulting absorption coefficient for photo-bleachable absorption (A value) is at least 0.4 $um^{-1}$.

The A value to be set is preferably in the range between 0.50 and 0.75 $um^{-1}$ at an irradiation wavelength of 436 nm. This is the case above a content of about 15% by weight, based on the total solids content, depending on the slightly varying molar extinctions of these isomers. The most preferred radiation-sensitive component is the 1,2-naphtho-quinonediazide-5-sulfonyltrisester of 1,3,5-trihydroxybenzene, which is preferably used in a concentration of 17-30% by weight, based on the total solids content.

The other conventional additives which can also be present in the silicon-containing photoresist compositions of the invention include compounds which increase the photosensitivity and/or the developing rate, for instance aromatic hydroxyl compounds such as polyhydroxy-benzophenones or benzotriazole derivatives, as well as substances which absorb scattered radiation, and dyes, levelling agents, plasticizers, adhesion primers, surfactants and stabilizers. Additives in these categories are sufficiently well known to those skilled in the art and are variously described in the appropriate specialist literature. The proportion of such additives, taken together, scarcely exceeds 30% by weight, based on the total solids content of the photoresist solution.

As additives of this type for increasing the developing rate, the positive photoresists of the invention preferably contain an aromatic hydroxyl compound in a proportion of 5-30% by weight, based on the total solids content.

Examples of compounds which can be used for this purpose are: 2,3,4-trihydroxybenzophenone, 4,4,'-dihydroxybiphenyl, 2,2,'-dihydroxybiphenyl, 4,4,'-dihydroxybenzophenone, bis(4-hydroxyphenyl) ether, bis(4-hydroxyphenyl) sulfide, bis(2,4-dihydroxyphenyl) sulfide, bis(4-hydroxyphenyl) sulfone and 2,2-bis(4-hydroxyphenyl)propane. 2,3,4-Trihydroxybenzophenone, bis(4-hydroxyphenyl) sulfone, 4,4,'-dihydroxybenzphenone and bis(2,4-dihydroxyphenyl) sulfide, in particular 2,3,4-trihydroxybenzophenone, are especially preferred.

The positive photoresists of the invention typically contain
50 to 65% by weight of alkali-soluble resin,
18 to 25% by weight of the 1,2-naphthoquinonediazide-5-sulfonyl tris-ester of 1,3,5-trihydroxybenzene,
15 to 25% by weight of 2,3,4-trihydroxybenzophenone and
1 to 5% by weight of compounds of formula I,
based in each case on the total solids content.

Suitable solvents for the preparation of the photoresist solution are, in principle, any solvents in which the solid constituents of the photoresist, such as alkali-soluble resin, quinonediazide compound, compound(s) of formula I and, if appropriate, other additives, are sufficiently soluble and which do not react irreversibly with these constituents. Examples of solvents which can be used for this purpose are aliphatic ketones such as methyl ethyl ketone, cyclopentanone or cyclohexanone, aliphatic esters such as butyl acetate, ethers such as anisole or tetrahydrofuran alcohols such as n- or i-propanol, monoethers or bisethers and mixed ether-ester derivatives of glycol compounds, such as ethylene glycol, diethylene glycol or propylene glycol, monooxocarboxylic acid esters such as ethyl lactate or ethyl 2-ethoxypropionate, lactones such as γ-butyrolactone, and cyclic amides such as 2-methylpyrrolidone. Aliphatic and aromatic hydrocarbons, such as n-hexane and xylene, are also used as solvents. Mixtures of said solvents are also frequently used. Photoresist solvents commonly contain ethoxyethyl acetate, methoxypropyl acetate or ethylene glycol dimethyl ether. The solvent conventionally represents a proportion of 40-90% by weight of the total photoresist solution.

The positive photoresists of the invention are formulated in a manner known per se by mixing or dissolving the components in the solvent mixture with incorporation of the additives to be used according to the invention. It is equally possible to treat ready-formulated positive photoresists, for example those available commercially, with the appropriate amount of additive. After the constituents have been dissolved in the solvent, the resulting photoresist solution is filtered through membrane filters with a pore width of 0.1–1 μm, depending on the requirements regarding freedom from particles. The total solids content of the photoresist is conventionally adjusted according to the desired layer thickness and coating method.

The positive photoresists of the invention are applied by processes known per se and with the process equipment conventionally used for this purpose. The photoresist solution is first applied to the substrate and dried. The substrates in question are predominantly semiconductor disks, e.g. silicon wafers which may or may not be coated with a layer of silicon dioxide, silicon nitride or aluminium. Other materials conventionally used in the manufacture of miniaturized circuits, such as germanium, gallium arsenide and ceramic, which may or may not be coated with noble metal, are also possible.

Coating is conventionally carried out by immersion, spraying, rolling or centrifugation. In the last of these coating methods, which is the one most frequently used, the resulting layer thickness is dependent on the viscosity of the photoresist solution, the solids content and the centrifugation speed. So-called centrifugation curves are determined for the photoresist in question and these are used to determine the resist layer thicknesses as a function of viscosity and centrifugation speed. The layer thicknesses for positive photoresists are typically in the range from 0.5 to 4 μm, especially up to 2 μm.

After the photoresist has been applied to the substrate, it is normally predried at temperatures in the range from 70° C. to 130° C. This can be done using ovens or heating plates. The drying time is in the range from about 15 to 45 minutes in ovens and in the range from about 0.5 to 4 minutes on heating plates. Preferably, 0.5-2 μm thick resist layers are dried for about 1 minute at about 100° C. on a heating plate.

The dried photoresist is then exposed imagewise through a mask using radiation with a wavelength in the range from about 300 nm to 450 nm. Either polychromatic or monochromatic exposure is possible. Commercially available apparatuses, e.g. scanning projection exposure apparatuses, contact and proximity exposure tools or wafer steppers, are preferably used for this purpose.

Preferably, the positive photoresists of the invention are exposed to monochromatic light at 436 nm, their excellent resolution properties being particularly apparent under these conditions.

The substrates which have been coated with the photoresist and exposed are finally developed with an aqueous-alkaline developer solution, e.g. by immersion or spraying, until the resist has been completely dissolved away in the exposed areas. It is possible to use a variety of developer formulations belonging either to the class of the metal ion-containing photoresist developers or to the class of the metal ion-free photoresist developers. The former are aqueous solutions of sodium hydroxide or potassium hydroxide which can also contain pH regulators and buffers, such as phosphates or silicates, as well as surfactants and stabilizers. The latter contain organic bases, e.g. tetramethylammonium hydroxide or choline, rather than alkaline metal compounds. The developing times depend on the exposure energy, the strength of the developer, the type of developing, the predrying temperature and the temperature of the developer. Developing times of about 1 minute are typical in the case of immersion developing. Developing is conventionally stopped by immersion in, or spraying with, deionized water and is normally followed by a final drying process in the temperature range from about 120° C. to 180° C.

It is precisely because the positive photoresists of the invention contain compounds of formula I that they prove particularly valuable for practical application, since structural changes such as flow phenomena, contour rounding etc., caused by the elevated temperature and the duration of the final drying process, can no longer occur in this final drying step.

The relief structures produced with the photoresists of the invention exhibit an excellent image resolution down to at least 0.6 μm, with high contrast, contour slope and contour sharpness. The loss of layer thickness in the unexposed areas is minimal. In the following procedures for the manufacture of integrated semiconductor circuits, such as acid or plasma etching, doping or coating, they have outstanding properties and provide active protection for the areas of the base which are covered with the photoresist relief structures.

EXAMPLES

A. Photoresist Formulations

Two stock photoresist formulations were prepared in the form of 35% solutions in diethylene glycol dimethyl ether comprising
60.0% by weight of m-cresol-novolak resin of average molecular weight $M\overline{w}=9,000$ (resin 1) or $M\overline{w}=16,000$ (resin 2),
18.9% by weight of the 1,2-naphthoquinonediazide-5-sulfonyl tris-ester of 1,3,5-trihydroxybenzene and
22.0% by weight of 2,3,4-trihydroxybenzophenone,
based on the total solids content. Samples of these solutions were treated with the following additives of formula I in the percentages given under C., based on the ready-to-use resist solutions:

| | |
|---|---|
| hydroxymethylsulfonylbenzene | (no. 1) |
| 1-(hydroxymethylsulfonyl)-4-methylbenzene | (no. 2) |
| 1-(hydroxymethylsulfonyl)-4-methoxybenzene | (no. 3) |
| 1-(hydroxymethylsulfonyl)-4-chlorobenzene | (no. 4) |
| 1-(hydroxymethylsulfonyl)-4-nitrobenzene | (no. 5) |

These solutions and comparative samples of the stock solution were filtered through a filter of 0.2 μm pore width.

B. Experimental Protocol

The photoresist formulations were centrifuged on to surface-oxidized silicon disks of 4 inches (=100 mm) diameter, the centrifugation speed being chosen so as to give a layer thickness of 1.5 μm in each case after drying on a heating plate for 1 minute at 100° C.

Monochromatic exposure at 436 nm was then carried out through a resolution test mask with a lens of numerical aperture NA=0.35; this was followed by developing by immersion in 1.62% aqueous tetramethylammonium hydroxide solution at 20° C. for 60 seconds.

The heat stability of the resist structures obtained was tested on a heating plate for 1 minute and in a circulating air dryer for 30 minutes, at 120° C. and 140° C. in both cases.

The resist structures obtained were inspected under a scanning electron microscope in respect of contour sharpness and/or any contour rounding according to the following scale of assessment:
1 = sharp contours, no contour rounding
2 = slight contour rounding
3 = marked contour rounding
4 = very substantial contour rounding

C. Result

The following Table shows that, because they contain additives of formula I, the resist structures with the formulations of the invention (Examples 1-6, 8, 9) have a considerably better heat stability than the formulations without additive (Comparative Examples 7 and 10).

| Example | Additive No./ Concentration | Resin | Thermal Heating 120° C. | Stability Plate 140° C. | Oven 120° C. | 140° C. |
|---|---|---|---|---|---|---|
| 1 | 1/2% | 1 | 1 | 2 | 1 | 2 |
| 2 | 2/2% | 1 | 1 | 2 | 1 | 2 |
| 3 | 2/4% | 1 | 1 | 1 | 1 | 1 |
| 4 | 3/2% | 1 | 1 | 2 | 1 | 2 |

-continued

| Example | Additive No./ Concentration | Resin | Thermal Heating 120° C. | Stability Plate 140° C. | Oven 120° C. | Oven 140° C. |
| --- | --- | --- | --- | --- | --- | --- |
| 5 | 4/2% | 1 | 1 | 2 | 1 | 2 |
| 6 | 5/2% | 1 | 1 | 2 | 1 | 2 |
| 7 (Comparison) | —/—% | 1 | 3 | 4 | 3 | 4 |
| 8 | 2/2% | 2 | 1 | 2 | 1 | 2 |
| 9 | 2/4% | 2 | 1 | 1 | 1 | 1 |
| 10 (Comparison) | —/—% | 2 | 3 | 4 | 3 | 4 |

What is claimed is:

1. A positive photoresist comprising,
   a) an organic solvent,
   b) at least one alkali-soluble phenolic resin, and
   c) at least one photosensitive quinonediazide compound, which photoresist contains at least one compound of formula I:

$$R^1-SO_2-CHR^2-X \quad (I).$$

wherein X is OH or $NR^3R^4$, $R^1$ to $R^4$ are each independently of the other alkyl, cycloalkyl, aryl or aralkyl containing up to 12 C atoms, the latter being unsubstituted or monosubstituted or polysubstituted by OH, halogen, cyano, nitro, alkyl, alkoxy, alkylthio, mono- or bis-alkyl- amino, alkanoyl, alkanoyloxy, alkanoylamido, alkoxycarbonyl, alkylaminocarbonyl or aryloxy containing up to 6 C atoms in each case, $R^2$ and $R^3$ are additionally hydrogen and $R^4$ is additionally the group $R^1-SO_2-CHR^2-$, in a proportion which increases the stability of photoresist relief structures produced with said photoresist towards changes due to thermal effects.

2. A positive photoresist according to claim 1 which contains 0.1 to 10% by weight, preferably 1 to 5% by weight, based on the total amount, of at least one compound of formula I.

3. A positive photoresist according to claim 1 which contains, as compound of formula I, at least one compound from the group comprising hydroxymethylsulfonylbenzene, 1-(hydroxymethylsulfonyl)-4-methylbenzene, 1-(hydroxymethylsulfonyl)-4-methoxybenzene, 1-(hydroxymethylsulfonyl)-4-chlorobenzene and 1-(hydroxymethylsulfonyl)-4-nitrobenzene.

* * * * *